United States Patent [19]
Chiu et al.

[11] Patent Number: 5,982,182
[45] Date of Patent: Nov. 9, 1999

[54] INTERFACE APPARATUS FOR AUTOMATIC TEST EQUIPMENT WITH POSITIONING MODULES INCORPORATING KINEMATIC SURFACES

[76] Inventors: Michael A. Chiu, 11 Fifth Street #2, Medford, Mass. 02155; David H. Levy, 16 Blake St., Cambridge, Mass. 02140; Alexander H. Slocum, 26 Gallen Dr., Concord, N.H. 03303

[21] Appl. No.: 08/414,456

[22] Filed: Mar. 31, 1995

Related U.S. Application Data

[63] Continuation of application No. 08/299,831, Sep. 1, 1994, abandoned.

[51] Int. Cl.⁶ ................................................. G01R 31/02
[52] U.S. Cl. ........................................... 324/754; 324/758
[58] Field of Search ...................... 324/754, 757, 324/758

[56] References Cited

U.S. PATENT DOCUMENTS

| | | | |
|---|---|---|---|
| 4,303,368 | 12/1981 | Dent et al. | 414/590 |
| 4,527,942 | 7/1985 | Smith | 414/590 |
| 4,588,346 | 5/1986 | Smith | 414/673 |
| 4,589,815 | 5/1986 | Smith | 414/590 |
| 4,610,020 | 9/1986 | La Finadra | 378/35 |
| 4,694,230 | 9/1987 | Slocum et al. | 318/568 |
| 4,705,447 | 11/1987 | Smith | 414/590 |
| 4,742,980 | 5/1988 | Heigl | 248/125 |
| 4,751,457 | 6/1988 | Veenendaal | 324/758 |
| 4,765,754 | 8/1988 | Slocum | 384/44 |
| 4,857,838 | 8/1989 | Willberg | 324/158 F |
| 4,893,074 | 1/1990 | Holt et al. | 324/158 F |
| 4,893,914 | 1/1990 | Hancock et al. | 359/392 |
| 4,943,020 | 7/1990 | Beaucoup et al. | 248/124 |
| 4,973,015 | 11/1990 | Beaucoup et al. | 248/124 |
| 5,091,693 | 2/1992 | Berry et al. | 324/158 F |
| 5,149,029 | 9/1992 | Smith | 248/124 |
| 5,241,870 | 9/1993 | Holt | 73/866.5 |
| 5,479,108 | 12/1995 | Cheng | 324/765 |

OTHER PUBLICATIONS

Slocum, A.H., "Kinematic couplings for precision fixturing —Part I: Formulation of design parameters," Precision Engineering, Butterworth & Co (Publishers) Ltd., Apr. 1988, vol. 10, No. 2, pp. 85–91.

*Primary Examiner*—Josie Ballato
*Assistant Examiner*—Russell M. Kobert
*Attorney, Agent, or Firm*—Edward J. Walsh

[57] ABSTRACT

A kinematic coupling for a test system with a test head which must be docked with a handling device. The coupling is implemented with a plurality of modules attached to the test head. Each module has one kinematic surface and is designed to mate with another kinematic surface on the handling device. Each module includes a motor which can extend or retract the kinematic surface. These modules allow docking of the test head to the handling device with a final motion perpendicular to the handler. They also allow the tilt angle between the test head and the handler to be adjusted to achieve planarization.

16 Claims, 3 Drawing Sheets

INTERFACE APPARATUS FOR AUTOMATIC TEST EQUIPMENT WITH POSITIONING MODULES INCORPORATING KINEMATIC SURFACES

This is a continuation in part of Ser. No. 08/299,831 filed Sep. 1, 1994, now abandoned.

This invention relates generally to automatic test equipment and more specifically to apparatus for interfacing automatic test equipment to devices which position semiconductor devices for testing.

During the manufacture of semiconductor components, the components are tested at various stages. Manufacturers have significant economic incentive to detect and discard faulty components as early in the manufacturing process as possible. For example, numerous semiconductor integrated circuits are usually fabricated on a large silicon wafer. The wafer is cut and the integrated circuits are separated into dies. The dies are then mounted into frames. Bond wires are attached to connect the die to leads which extend from the frame. The frame is then encapsulated in plastic or other packaging martial, producing a finished product.

This manufacturing process is relatively expensive. Accordingly, most semiconductor manufacturers test each integrated circuit on the wafer before the wafer is cut. The defective integrated circuits are marked and discarded after the wafer is cut. In this way, the cost of packaging the defective dies is saved. As a final check, most manufacturers test each finished product before it is shipped. Manufacturers who guarantee that a very high percentage of the semiconductor components delivered to their customers will function properly can charge higher prices for their products.

Semiconductor components are generally produced in large quantities. To rapidly test large quantities of components, automatic test equipment (generally "testers") are used. A tester rapidly generates input signals for application to the integrated circuit and can determine whether the appropriate response signals are generated. Because testers are highly automated, they can run through a series of millions of test cases in a few seconds.

To efficiently test integrated circuits, some device is needed to move and quickly connect the device being tested to the tester. To move wafers 322, a device called a "prober" is used. To move packaged parts, a device called an "handler" is used. These devices precisely position the component being tested so that it makes electrical contact with outputs of the tester. Probers, handlers and other devices for positioning a device under test relative to the test head are called generically "handling devices 350."

Connecting the handling device to the tester poses several challenges. First, semiconductor circuits have many inputs and outputs. Typical circuits might have between 20 and 100 inputs and outputs. However, some larger circuits have as many as 500 inputs and outputs and circuits with over 1,000 inputs and outputs are being contemplated. Thus, the tester must generate and receive hundreds of signals. The electronic circuitry needed for driving and receiving these signals must be as close to the device being tested as possible to allow high speed operation.

Consequently, most testers are designed with a test head 314 that includes all of the driving and receiving circuitry. The test head is connected via a cable bundle 312 to an electronics cabinet 310 which contains data processing circuitry which determines which signals should be driven and compares the received signals to expected values.

The test head can be up to a few feet in diameter in order to hold all of the driving and receiving circuitry. The device being tested is on the order of a square inch in the case of a finished product and is even smaller in the case of an integrated circuit on a wafer. To make electrical contact, the hundreds of signals leaving the test head must be squeezed into a very small area.

An interface carries the test signals between the test head and the wafer. The test head side of the interface typically includes a device interface board, or "DIB." The DIB sometimes includes circuitry which customizes the tester for a specific semiconductor component being tested and must therefore be able to be removed from the test head. Spring loaded contacts within the test head carry signals between the DIB and the test head.

A "probe card" forms the prober side of the interface. Spring loaded contacts carry the signals between the DIB and the probe card.

The probe card 320 has numerous probe wires on one side. The probe wires are positioned to make contact with test pads on the semiconductor circuit. When the probe card is manufactured, the lengths of the probe wires are adjusted so that all of the tips of the wires are in one plane.

A mechanical locking ring or a collar holds the interface together. Generally, the interface is mounted to the prober or handling device. Ideally, this arrangement would ensure that the tips of the probe wires are all in a plane parallel with the surface of the semiconductor wafer. Probers can generally rotate and translate the semiconductor wafer in this parallel plane to align the probe wires with the contact points on the semiconductor components. This plane is generally called the "X-Y plane."

However, commercially available probers do not have the ability to move the semiconductor wafer to account for the tips of the probe wires being out of the X-Y plane. As a result, precision manufacturing techniques are required to ensure that the probe card is mounted parallel with the semiconductor wafer. It would be desirable if a simple method could be devised to "planarize" the tips of the probe wires and the surface of the semiconductor wafer without precision manufacturing techniques. Further, the large weight of the test head can cause the probe card to move out of the X-Y plane even if precision manufacturing techniques are used. If the tips of the probe card move out of the X-Y plane, the tester might not make good electrical contact to the device under test and unreliable results will be obtained.

A further difficulty with current test head/prober interfaces is that it is often necessary to change the device interface board or probe card. A different device interface board or probe card is likely to be needed to test different types of components or to conduct different tests on the same type of component. To make the change, it is necessary that test head be removed from prober.

A test head is a large device and can weigh in excess of 500 pounds. To facilitate movement, the test head is attached to a manipulator via support arm. The manipulator contains counterweights or other mechanical devices to make movement of the test head easier. The manipulator might also be calibrated such that when the test head is moved, it can be returned as closely as possible to the same location given its design and the tolerances in manufacture. Guide posts on the prober also aid in returning the test head to its original position.

If, when the test head is repositioned, it is not in exactly the same place, a calibration routine must be run by the prober to reposition the semiconductor wafer with respect to the probe card. Calibrating the prober in this fashion can take a long time, which is undesirable in a manufacturing operation. It is therefore highly desirable for the docking between the test head and the handling device to be repeatable.

We have identified a second problem associated with moving the test head. Contact pads on the DIB or spring contacts inside the test head are sometimes damaged as the test head is repositioned. If the test head is first moved perpendicularly to the interface such that the spring pins in the tester are pressed against the contact pads on the DIB and then moved parallel to the interface, the spring pins will drag across the contact pads. If there is sufficient loading on the spring pins, the contact pads or spring pins will drag across the contact pads. If there is sufficient loading on the spring pins, the contact pads or sprin pins will be damaged. Accordingly, it is desirable that the positioning system only allow motion of the test head perpendicular to the interface as the test head gets close to its final position.

SUMMARY OF THE INVENTION

With the foregoing background in mind, it is an object of the invention to provide an improved interface for automatic test equipment.

It is also an object to provide a mechanical interface between a test head and a handling device which precisely and repeatedly positions an electrical interface relative to the handling device.

It is another object to provide a mechanical interface between a test head and a handling device which provides constant force between the test head and the handling device.

It is still a further object to provide a mechanical interface between two bodies which allows only perpendicular motion during docking of the test head to the handling device.

It is also an object to provide an interface arrangement allowing probes on the test head to be planarized in relation to a device under test.

It is also an object to provide an interface arrangement which can be used with a plurality of different shaped test heads or handling devices.

The foregoing and other objects are achieved by an interface involving kinematic coupling between the test head and the handling device. In one embodiment, the kinematic coupling is provided by curved components which mate with grooves.

In a preferred embodiment, kinematic surfaces are mounted on the handling device. Kinematic mating surfaces are attached to modules, which may be easily mounted to the external surface of the test head.

In yet another embodiment, each module includes a motor which can change the distance between the kinematic mating surface and the test head. By extending the kinematic mating surfaces away from the test head prior to docking, the kinematic contact can be made with the test head held away from the handling device. The kinematic mating surfaces can then be moved towards the test head to make electrical contact between probes on the test head and the DUT. Also, by selectively adjusting the spacing between each kinematic mating surface and the test head, the probes may be planarized to the device under test.

BRIEF DESCRIPTION OF THE DRAWINGS

The invention may be better understood by reference to the following more detailed description and accompanying drawings in which.

DESCRIPTION OF THE PREFERRED EMBODIMENT

Figure 1:
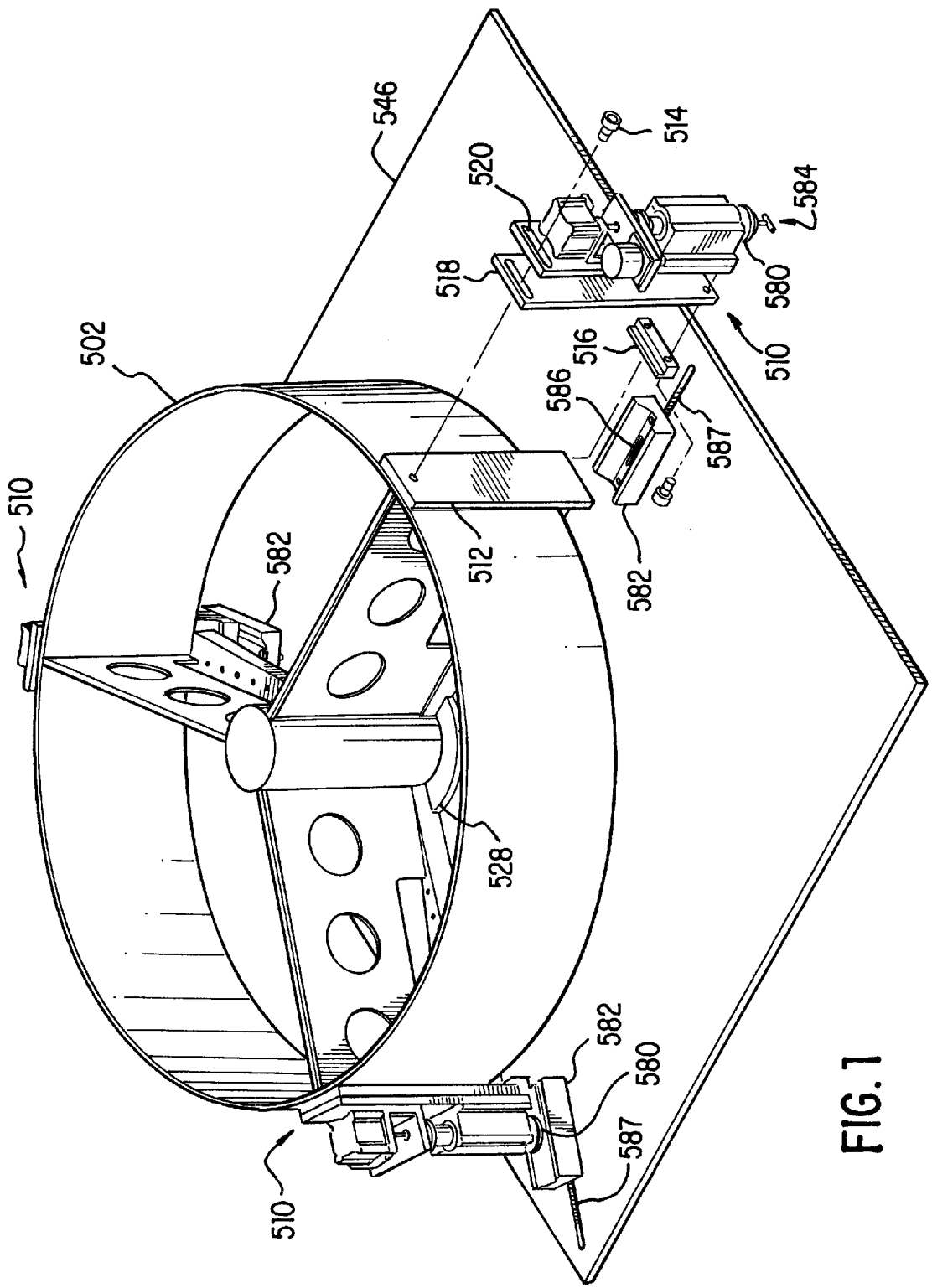
FIG. 1 is a sketch of a modular arrangement for mounting kinematic surfaces on a test head.

A kinematic coupling between a test head and a prober is disclosed in US patent application Ser. No. 08/299,831 filed Sep. 1, 1994, by Slocum et al. entitled "Interface Apparatus For Automatic Test Equipment," which is hereby incorporated by reference. That patent application describes that an accurate and repeatable interface between a test head and a handling device can be formed by a kinematic coupling between the test head and the handling device.

A kinematic coupling is formed by establishing contact at exactly six points. A preferred way to establish contact at six points is to use three balls mating with three grooves. Each ball contacts one side of each groove at a single point. Since the three grooves each have two sides, this mating arrangement establishes six contact points.

The embodiment described herein provides the benefits of kinematic coupling as described in the above mentioned patent application. In addition, it simplifies the assembly operation and reduces the number of parts which must be assembled with high precision. It further facilitates vertical docking and "autoplanarization," as described below.

OPERATION OF KINEMATIC COUPLING

Kinematic coupling is well known. It is described in reference texts such as *Precision Machine Design* by Alexander H. Slocum, Prentice Hall 1992 and in papers such as A. Slocum, *Kinematic Coupling For Precision Fixturing—Part 1: Formulation of Design Parameters,* Precis. Eng., Vol. 10 No. 2, 1988; A. Slocum and A. Donmez, *Kinematic Couplings for Precision Fixturing—Part 2: Experimental Determination of Repeatability and Stiffness,* Precis. Eng., Vol. 10, No. 3, 1988; and *Design of Three-Groove Kinematic Couplings* by Alexander H. Slocum, Precis. Eng., pp 67–75, 1992, all of which are hereby incorporated by reference. Briefly, the theory behind kinematic coupling is that to accurately position a body, it should be contacted at the fewest number of points needed to constrain motion in all degrees of freedom in which motion is to be prohibited. To constrain motion in the six degrees of freedom, six contact points are needed, provided that no more than two of the contact points are colinear.

In the preferred embodiment, three balls are mated in three grooves. Each groove has two surfaces, each of which contacts a ball at only one point. Thus, the combination of three balls and three groves forms a kinematic coupling sufficient to restrain motion in the six degrees of freedom.

In the preferred embodiment, the grooves are as widely spaced as practical. In addition, the grooves are oriented to provide the greatest possible stability according to the techniques detailed in the aforesaid references.

Each pair of a ball and groove is termed a "kinematic contact" because the pair provides some of the contacts needed to form the kinematic coupling. Each side of a groove is termed a "kinematic surface" because it provides for contact at a single point. The ball is called a "kinematic mating surface" because it contacts a kinematic surface at only one point. For satisfactory operation of a kinematic coupling, it is not necessary that grooves be used to form the kinematic surfaces. Other shapes, such as a gothic arch, can be used as well. It is also not necessary that a ball be used as the kinematic mating surface. Other shapes, such as the tip of a cone, can be made to contact a surface at a single point. Likewise, it is not necessary that each kinematic contact include two kinematic surfaces. Examples of other suitable kinematic contacts are: a ball pressing against a flat surface (one kinematic surface per contact); a ball pressing against a tetrahedron (three kinematic surfaces per contact) or a ball pressing against three balls (three kinematic surfaces per contact). Different types of contacts may be used in one coupling as long as there are six kinematic surfaces in total.

Modular Construction

FIG. 1 shows an embodiment in which kinematic surfaces are fabricated as modules so that they may be easily attached to a test head and a handling device of any design. Support structure 502 of a test head is shown. For clarity, the electronics and covering of the test head are not shown.

Three mounting blocks 512 are shown on the exterior surface of support structure 502. Each mounting block 512 provides an attachment point for a module 510.

Each module 510 includes a spherical surface 580. Each spherical surface 580 is positioned to mate with a groove 582 on surface 546 of a handling device. The combination of spherical surface 580 and groove 582 forms a kinematic contact as described above.

Module 510 includes L bracket 516 on its lower edge. L bracket 516 slips under mounting block 512, holding the lower edge of module 510 to mounting block 512. The upper edge of module 510 is secured to mounting block 512 by screw 514, thereby firmly holding module 510 in place.

Screw 514 passes through slot 520. With screw 514 loosened, module 510 may be slid transversely relative to mounting block 512. In this way, module 510 can be positioned to accommodate docking with a range of different handlers which might have grooved blocks 582 mounted in different locations.

FIG. 1 shows that spacer 518 is placed between module 510 and mounting block 512. Spacer 518 provides another method of adjusting the position of module 510 relative to mounting block 512. However, it should be appreciated that a kinematic coupling can be used to form a repeatable, stable interface regardless of the exact position of the kinematic surfaces forming the coupling.

Because the contact between test head 502 and handling device 546 is kinematic, neither the groove 582 nor the module 510 needs to be positioned with high accuracy. The three grooves 582 and three spherical surfaces 580 form a kinematic contact which is repeatable.

If the positioning of the grooves 582 and modules 510 results in the probe card in the test head being rotated in the X-Y plane relative to device under test in the handling device, the normal calibration routine of the handling device will compensate for this rotation. If the positioning of grooves 582 and modules 510 results in the tips of the probe wires being skewed with respect to the plane of the device under test in the handling device, an "autoplanarization" routine as described below will compensate for the skew. However, once the compensation routine has been performed, the test head may be moved and will return to same position.

In the embodiment of FIG. 1, spherical surface 580 has a T shaped post 584 extending through it. Grooved block 582 has a slot 586 cut in it to receive T shaped post 584. To insert T shaped post 584 into slot 586, T shaped post 584 is rotated to be parallel with slot 586. Once inserted in slot 586, T shaped post can be rotated to be perpendicular to slot 586, locking module 510 to surface 546. Module 510 then exerts an upward force on T shaped post 584, preloading the kinematic contact, as described above. Rotation of T shaped post 584 could be done manually, such as by actuating a lever attached to the post. Alternatively, the rotation could be automated with a motor, solenoid or similar device.

Grooved block 582 is secured to surface 546, which represents the upper surface of a handling device. For convenience, grooved block 582 is mounted in slot 587, allowing the position of grooved block 582 to be adjusted to accommodate different sized test heads.

Figure 2:
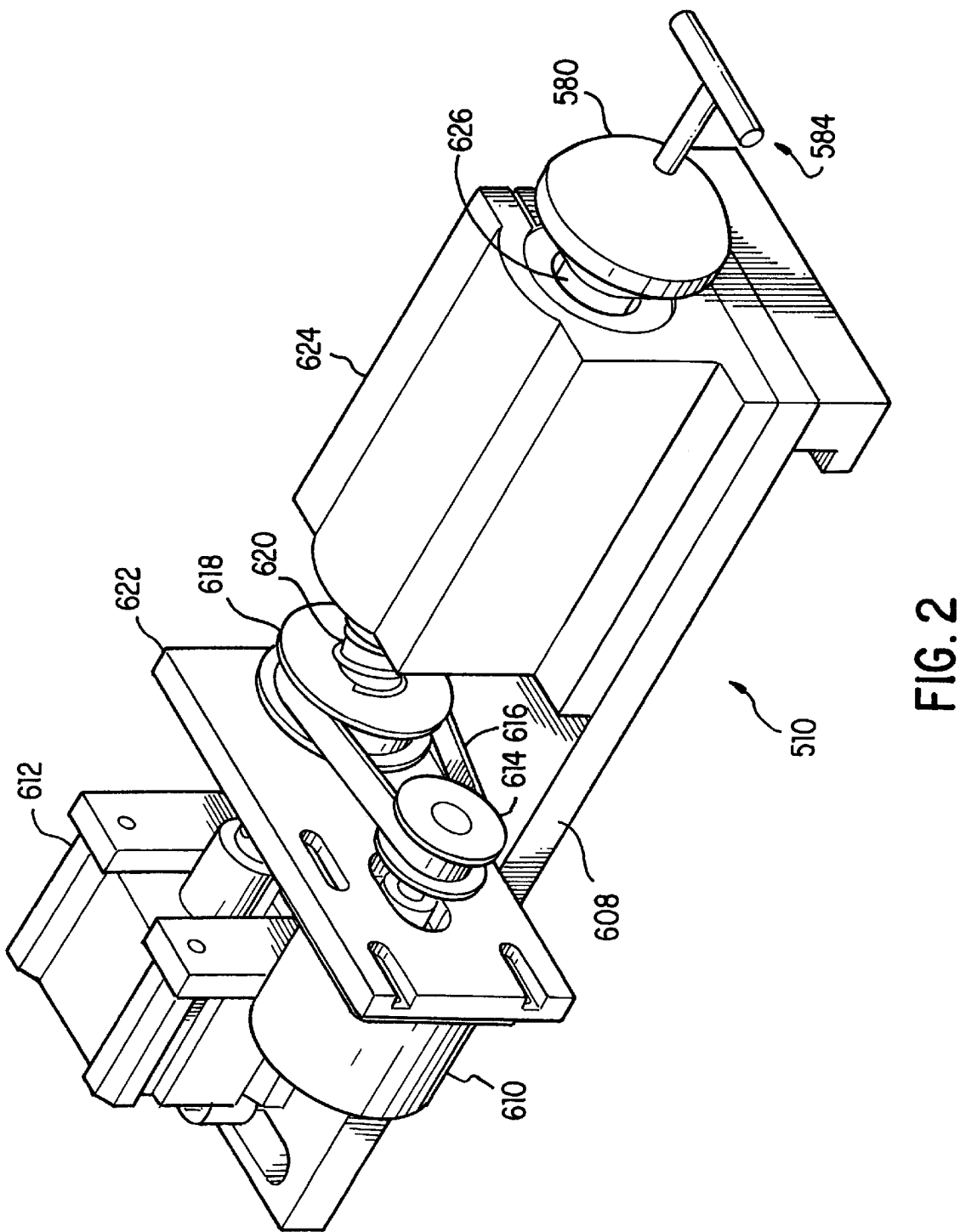
FIG. 2 is a sketch showing greater detail of the modules of FIG. 1.
Figure 3:
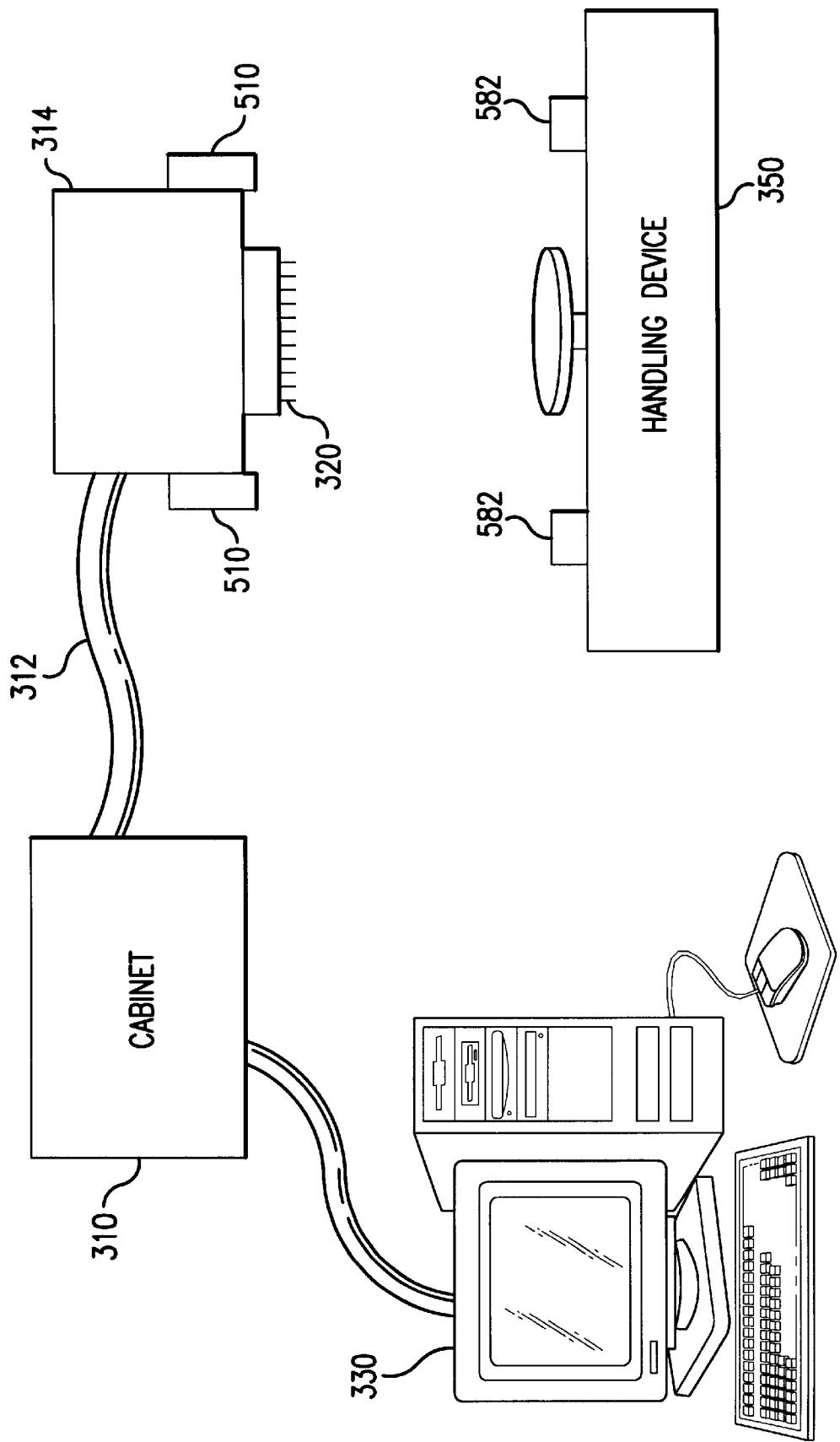
FIG. 3 is a sketch showing a test system employing a modular interface according to the invention.

Turning to FIG. 2, further details of module 510 are shown. Plate 608 forms a support for module 510. Plate 622 is mounted perpendicular to plate 608.

Motor 610 is mounted to plate 622. Pulley 614 is mounted to the shaft (not shown) of motor 610. Drive belt 616 couples rotation of the shaft to pulley 618.

Pulley 618 is mounted to lead screw 620. Lead screw 620 is mounted in a bearing attached to plate 622 such that it is free to rotate but not to move along its axis.

Spherical surface 580 is attached to a shaft 626. Shaft 626 is supported by linear recirculating bearings 624, such as what is known as a pillow block sold by Thomson Industries of Port Washington, N.Y. Bearings 624 allow shaft 626, and hence spherical surface 580, to move transversely along the length of shaft 626.

Shaft 626 has at least a hollow portion with a threaded inner surface (not shown). Lead screw 620 engages this threaded inner surface. Rotation of lead screw 620 drives shaft 626 in the direction of its length. As will be discussed below, this motion facilitates docking of the test head to the handling device.

A position encoder might be included on motor 610 or lead screw 620 to indicate the position of shaft 626 and spherical surface 580. The position encoder could be used to return spherical surface 580 to a known position.

T shaped post 584 extends through shaft 626, lead screw 620 and plate 622 to linear actuator 612. Linear actuator 612 could be an air cylinder as described above. When actuated, it pulls on T shaped post 584 with a constant force, thereby providing the preload force needed for repeatable docking of a test head to a handling device.

Control electronics for motor 610 and actuator 612 are not explicitly shown. However, a test head is a portion of a test system, which includes a computer controller 350. In a preferred embodiment, the computer controller in the test system is programmed to control these devices.

Vertical Docking and Autoplanarization

With a conventional interface, the test head is docked to the handling device by making contact with the interface, which is attached to the handling device. Spring pins in the test head are pressed into contact with the contact pads on the device interface board. With such an interface, it is desirable that the docking be completed with the final motion of the test head being vertical motion. Vertical motion means that the test head is moved perpendicular to the interface. The vertical motion prevents the spring pins from sliding across the contact pads and damaging either the spring pins or the contact pads.

Before docking of a test head to a handling device, lead screw 620 is rotated to extend shaft 626. Spherical surfaces 580 are then brought into contact with grooved blocks 582 (FIG. 1) and secured by rotating T shaped posts 584 into the locking position. Linear actuator 612 is then actuated, causing a preload force to exist between spherical surface 580 and grooved block 582.

Shafts 626, in their extended position, will act as legs to keep the test head away from surface 546. There is no danger that the spring pins on the test head will damage the contact pads on the interface. In this configuration, the test head may not move parallel to surface 546.

Lead screw 620 is then rotated to retract shafts 626. As shafts 626 are retracted, spring contacts in the test head will come into contact with the interface. To ensure purely vertical motion, all shafts 626 are retracted the same amount simultaneously. Significantly, the motion which brings the test head into contact with the interface is constrained to be perpendicular to surface 546, thus preventing damage to the contact pads caused by scraping of the spring pins across their surface.

An alternative interface might be used in which the interface, rather than being attached to the handling device, is attached to the test head. With such an interface, a locking ring, or similar attachment device, can be used to hold the interface to the test head. Attaching the interface to the test head makes contact between the spring pins in the test head and the contact pads on the DIB. There is, thus, less need for vertical docking with such an interface.

However, because the interface, including the probe card is not mounted on the prober, it is necessary to ensure that the tips of the probe wires are planarized to the surface of the device under test. The modules of FIG. 2 allow this planarization to take place.

It is not necessary that all lead screws 620 be adjusted simultaneously. It is also not necessary that each lead screw 620 be adjusted the same amount. By applying different adjustments to each of the lead screws 620, probe card 528 can be tilted with respect to surface 546. Significantly, probe card 528 can be tilted until the probe tips (not shown) on the probe card are coplanar with the DUT which is held in a chuck below surface 546.

Making the probe tips planar with the DUT is an important capability, which is sometimes called "planarization." To test the DUT, all of the probe tips must be in contact with the DUT surface, which requires planarization.

The mechanism of FIG. 1 can be used for planarization. Preferably, it will be used in conjunction with some mechanism which provides a measurement of the planarity of the chuck or DUT and the probe card tips. This measurement can be made in various ways. One way is to incorporate a position measuring system into the handling system. For example, a video camera attached to an image processor might be used. The video camera is mounted within the handling device to be planar with the chuck or DUT and aimed at the probe tips. The resulting image is processed to determine whether all of the probe tips are in the same plane of focus. By adjusting the focus on the camera, it is possible to determine the relative distance between each of the probe tips and the camera. This information can be translated into a value representing the amount the probe card must be tilted to planarize the probe tips and DUT.

An alternative method is to replace the probe card with a device including at least three sensors which are mounted to be planar with the probe tips when the probe card is installed. The test head could then be lowered until the sensors make contact with the DUT in the chuck or some other flat surface held in the chuck for planarization. The sensors could simply be contact sensors. When contact sensors are used, the relative time at which each sensor makes contact would be observed. The sensors which contact first are closer to the surface. This information can be used to estimate the tilt angle between the sensors and the DUT.

Alternatively, the sensors could be force sensors. In this scenario, the test head would be lowered until all of the sensors contact the DUT or flat surface in the chuck. Then, the relative force on each sensor would be measured. The sensors with higher force are on a portion of the surface which is tilted toward the DUT. The relative forces can also be used to estimate the tilt angle between the sensors and the DUT.

As yet another alternative, it should be noted that probe tips themselves can act as a form of contact sensors. Each probe tip is connected to electronic circuitry inside the tester which is designed to inject and measure electrical signals at the probe. The electrical signal at the probe tip will change when it makes contact to the DUT. This change can be measured by the electronic circuitry in the tester to determine when each probe has contacted to the DUT or other surface.

Regardless of what type of sensor is used, the sensors form a part of a feedback loop. The information from the sensors is provided to the computer work station (not shown) attached to the tester. The computer work station computes commands for each of the motors 610 to improve the planarity. The motors are adjusted and then the measurements and adjustments are repeated until there is adequate planarity.

Where the position information is derived from apparatus in the handling device, it is necessary that there be an interface between the computer work station controlling the tester and the handling device. Such an interface between computers or computer controlled systems are well known. The interface would at a minimum need to transfer a command from the computer work station to the handling device indicating that a planarity measurement should be made. The measurement of the tilt angle would then have to be provided over the interface to the computer work station. Any interface could be used as long as both the computer work station and handling device both use the same one.

Various changes and substitutions could also be made to the disclosed preferred embodiments without departing from the invention. For example, FIG. 2 shows a pneumatic actuator used to apply a preload force to a kinematic contact. Any other means of applying a preload force could be used.

Balls and grooves are shown as the kinematic contacts. The position of the balls and grooves could be interchanged. For example, spherical surfaces 580 could be mounted on the prober and grooves 582 could be mounted on the test head. Also, the kinematic contacts need not be limited to balls and grooves. Any kinematic contacts forming a kinematic coupling could be used.

Further, a probe card with probe wires was described. The invention can be used regardless of the method used to probe a device. For example, the invention works equally well if a conductive membrane or blades are used for probing a wafer.

Also, in FIG. 2, a lead screw is used to extend and retract spherical surface 580. Any device for providing transverse motion could be used. For example, a solenoid might be used. The solenoid might be used to extend shaft 626 prior to docking. Once the test head is positioned above the probe card, the solenoid could be used to retract shaft 626. A damping cylinder might be used to ensure the test head is lowered slowly.

Using a device such as a solenoid in place of the lead screw still provides the advantage of having only perpendicular motion of the test head relative to the handling device during the final stage of docking. Some such devices for imparting transverse motion on shaft can not easily be used to adjust the height of spherical surface 580, which is needed for planarization. However, to achieve some advantages of the invention, it is not necessary that the coupling be configured for planarization.

Also, FIG. 2 shows that kinematic contacts are used in conjunction with a mechanism for extending and retracting the contacts. The advantage of having the test head moving only perpendicularly to upper surface 546 can be achieved regardless of the type of contact used. The advantage of having the position of the contact surfaces independently adjustable for planarization can also be achieved without the use of kinematic contacts. However, a kinematic coupling offer the advantage of providing a stable coupling regardless of the position.

FIG. 1 shows that each kinematic contact is constructed as a module that can be easily repositioned on a test head. This simplifies docking of a test head to different types of handling devices or docking of a handling device to different types of test heads. Because the module is mounted on the external surface of the test head, mounting is very easy. Existing test heads can be retrofitted with modules. Also, the module is less likely to interfere with electronic components in the test head. However, the contact could be easily incorporated into the test head or mounted in another way where this flexibility is not required.

As shown in the figures, the coupling is made up of several contacts, each with two surfaces. The position of one surface in each contact is adjustable to provide perpendicular docking as well as for planarization. To provide planarization only, it is not necessary that all of the contacts have adjustable surfaces.

It is also not necessary that the adjustable contact surfaces be mounted on the test head. The adjustable contact portion could equally well be installed in the handling device. Such a configuration might be preferred when the device for measuring the tilt angle of the probe to the chuck in the handling device is located in the handling device.

It was described that the control signals which control the position of the contact surfaces are generated by a computer work station attached to the tester. The control signals might be generated in other ways. For example, they might be generated in one of the computers which controls the handling device. Alternatively, they might be generated by a separate computing device or controller added to the system for that purpose.

It should also be noted that the invention was illustrated when used to interface a test head to a prober. The invention may also be used as an interface to a handler for packaged IC parts. If used with a handler, there might be no need for a probe card. Traditionally, handlers plug packaged parts into sockets mounted to the device interface board. Also, handlers generally are oriented vertically whereas probers generally are oriented horizontally. The interface of the invention is useful in all orientations.

Further, it should be noted that planarization was achieved by moving the test head with respect to the device under test. It is not necessary that the entire test head be moved. For example, just the interface might be moved for planarization. Alternatively, only some pieces of the interface might move. Actuators might be attached to the DIB or the probe card to move these pieces instead of the entire test head. U.S. patent application Ser. No. 08/299,831 shows a kinematic coupling between a probe card and a test head. Actuators might be used to selectively extend or retract the kinematic surfaces of this coupling to achieve planarization.

Further, it is not necessary that relative tilt angle of the probe card and device under test be changed by tilting a part on the test head. A similar result can be achieved by tilting the device under test within the handling device. With such an embodiment, the actuators would be included in the handling device.

It is felt, therefore, that the invention should be limited only by the spirit and scope of the appended claims.

What is claimed is:

1. A module adapted for use in an automatic test system of the type having a handling device and a tester, comprising:

a) a base, separate from both the tester and the handling device;

b) a member connected to the base, the member having a kinematic surface; and c) means for connecting the base to one of the handling device and the tester to form a mechanical coupling between the tester and the handling device.

2. The module of claim 1 wherein the kinematic surface comprises a spherical surface.

3. The module of claim 1 additionally comprising:

a) a shaft attached to the member, the shaft having an axis;

b) a bearing holding the shaft while allowing motion along the axis; and c) a motor coupled to the shaft.

4. The module of claim 3 additionally comprising a lead screw coupling the motor to the shaft.

5. The module of claim 1 adapted to form a mechanical coupling between the tester and the handling device, additionally comprising:

a) a post extending through the kinematic surface; and e) means for applying a force to the post.

6. The module of claim 5 wherein the post is T shaped.

7. The module of claim 5 wherein the means for applying a force to the post comprises a linear actuator.

8. The module of claim 1 additionally comprising means for adjustably mounting the module to a test head.

9. The module of claim 1 wherein the means for connecting the base to one of the handling device and the tester comprises a bracket and a slot for receiving a screw.

10. The module of claim 1 wherein the means for connecting the base to one of the handling device and the tester incorporates means for adjusting the point of attachment of the module.

11. A test system for semiconductor components having a test head and incorporating the module of claim 1, said module being attached to an exterior surface of the test head by the means for connecting.

12. The test system of claim 11 incorporating two additional modules as in claim 1, each said additional module having respective means for connecting and each module being attached to the test head by its respective means for connecting.

13. The module of claim 1 wherein the kinematic surface comprises a surface in the group consisting of a spherical surface, a grooved surface and a gothic arch.

14. The module of claim 1 additionally comprising means for applying a preload force to the kinematic surface.

15. The module of claim 14 wherein the means for applying a preload force comprises a post extending through the kinematic surface, the post being movable relative to the kinematic surface.

16. The module of claim 15 wherein the means for applying a preload force additionally comprises a linear actuator attached to the post.

* * * * *